(12) United States Patent
Juengling

(10) Patent No.: US 9,553,193 B2
(45) Date of Patent: Jan. 24, 2017

(54) DOUBLE GATED FIN TRANSISTORS AND METHODS OF FABRICATING AND OPERATING THE SAME

(75) Inventor: Werner Juengling, Boise, ID (US)

(73) Assignee: Micron Technology, Inc., Boise, ID (US)

(*) Notice: Subject to any disclaimer, the term of this patent is extended or adjusted under 35 U.S.C. 154(b) by 1377 days.

(21) Appl. No.: 12/950,787

(22) Filed: Nov. 19, 2010

(65) Prior Publication Data

US 2012/0126884 A1     May 24, 2012

(51) Int. Cl.
| | |
|---|---|
| H01L 27/118 | (2006.01) |
| H01L 29/78 | (2006.01) |
| H01L 27/108 | (2006.01) |
| H01L 29/66 | (2006.01) |

(52) U.S. Cl.
CPC ....... *H01L 29/785* (2013.01); *H01L 27/10826* (2013.01); *H01L 27/10879* (2013.01); *H01L 29/66795* (2013.01)

(58) Field of Classification Search
CPC .................................................. H01L 29/785
USPC .............. 257/213, 242, 249, 250, 263, 278, 302,257/315, 319, 329, 331
See application file for complete search history.

(56) References Cited

U.S. PATENT DOCUMENTS

| | | | |
|---|---|---|---|
| 5,315,143 A | 5/1994 | Tsuji | |
| 5,929,477 A * | 7/1999 | McAllister Burns et al. | 257/306 |
| 6,077,745 A | 6/2000 | Burns, Jr. et al. | |
| 6,900,102 B2 | 5/2005 | Lee et al. | |
| 6,977,404 B2 | 12/2005 | Katsumata et al. | |
| 7,566,620 B2 | 7/2009 | Abbott | |
| 7,573,108 B2 | 8/2009 | Juengling | |
| 7,635,648 B2 | 12/2009 | Peidous et al. | |
| 7,742,324 B2 | 6/2010 | Juengling | |
| 7,808,042 B2 | 10/2010 | Juengling | |
| 8,148,775 B2 | 4/2012 | Gilgen et al. | |
| 2003/0193065 A1 | 10/2003 | Fried et al. | |
| 2009/0057778 A1 * | 3/2009 | Dreeskornfeld et al. | 257/392 |
| 2009/0206400 A1 | 8/2009 | Juengling | |
| 2009/0206443 A1 | 8/2009 | Juengling | |
| 2009/0224357 A1 | 9/2009 | Juengling | |
| 2009/0237996 A1 | 9/2009 | Kirsch et al. | |

(Continued)

FOREIGN PATENT DOCUMENTS

WO     2007085996     8/2007

OTHER PUBLICATIONS

U.S. Appl. No. 12/950,761, filed Nov. 19, 2010, Werner Juengling.

(Continued)

*Primary Examiner* — Julia Slutsker
(74) *Attorney, Agent, or Firm* — Fletcher Yoder, P.C.

(57) ABSTRACT

A semiconductor device is provided that includes a fin having a first upper gate on a sidewall of the fin in a first trench and a second upper gate formed on the opposite sidewall of the fin. The device also includes a first lower gate on the sidewall and a second lower gate on the opposite sidewall, wherein the first upper gate is formed above the first lower gate and the second upper gate is formed above the second lower gate. Methods of manufacturing and operating the device are also included. A method of operation may include biasing the first upper gate and second upper gate to preselect the transistors of a fin and then biasing the first lower gate and second lower gate to operate the transistors of the fin.

16 Claims, 17 Drawing Sheets

(56) References Cited

U.S. PATENT DOCUMENTS

2009/0238010 A1    9/2009   Juengling
2009/0251946 A1   10/2009   Juengling
2009/0294842 A1   12/2009   Juengling
2010/0066440 A1    3/2010   Juengling

OTHER PUBLICATIONS

U.S. Appl. No. 12/950,774, filed Nov. 19, 2010, Werner Juengling.
U.S. Appl. No. 12/950,797, filed Nov. 19, 2010, Werner Juengling.
U.S. Appl. No. 12/702,123, filed Feb. 8, 2010, Werner Juengling.
U.S. Appl. No. 12/702,947, filed Feb. 9, 2010, Werner Juengling.
Taiwan Office Action for Application No. 100141885 dated Nov. 26, 2014, 6 pgs.

* cited by examiner

DOUBLE GATED FIN TRANSISTORS AND METHODS OF FABRICATING AND OPERATING THE SAME

BACKGROUND

Field of Invention

Embodiments of the invention relate generally to electronic devices, and more specifically, to non-planar transistors and techniques for fabricating the same Description of Related Art This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Fin field effect transistors (finFETs) are often built around a fin (e.g., a tall, thin semiconductive member) extending generally perpendicularly from a substrate. Typically, a gate traverses the fin by conformally running up one side of the fin over the top and down the other side of the fin. Generally, a source and a drain are located on opposite sides of the gate in the fin. In operation, a current through the fin between the source and drain is controlled by selectively biasing the gate.

High aspect ratio fins typically are desirable but challenging to construct. Generally, high aspect ratio finFETs can be integrated into a small area of the substrate, thereby potentially reducing manufacturing costs on a per-transistor basis. To increase density of the transistors, the width of each fin, and the gap between each fin, may be reduced. As the dimensions of the fin structures and the space between each fin are reduced, construction of gates or other structures, and operation and control of the transistors may be increasingly difficult.

DETAILED DESCRIPTION

Some of the subsequently discussed embodiments may facilitate the manufacture of high aspect ratio structures such as finFETs having double gates for improved selection and operation. As is described in detail below, a highly resistive upper gate and a low resistive lower gate may be formed between each fin. The fin transistors may be operated by biasing the lower gate and upper gate, such that the lower gates provide preselection of a fin during biasing of the upper gates. The following discussion describes devices and process flows in accordance with embodiments of the present technique.

Figure 1:
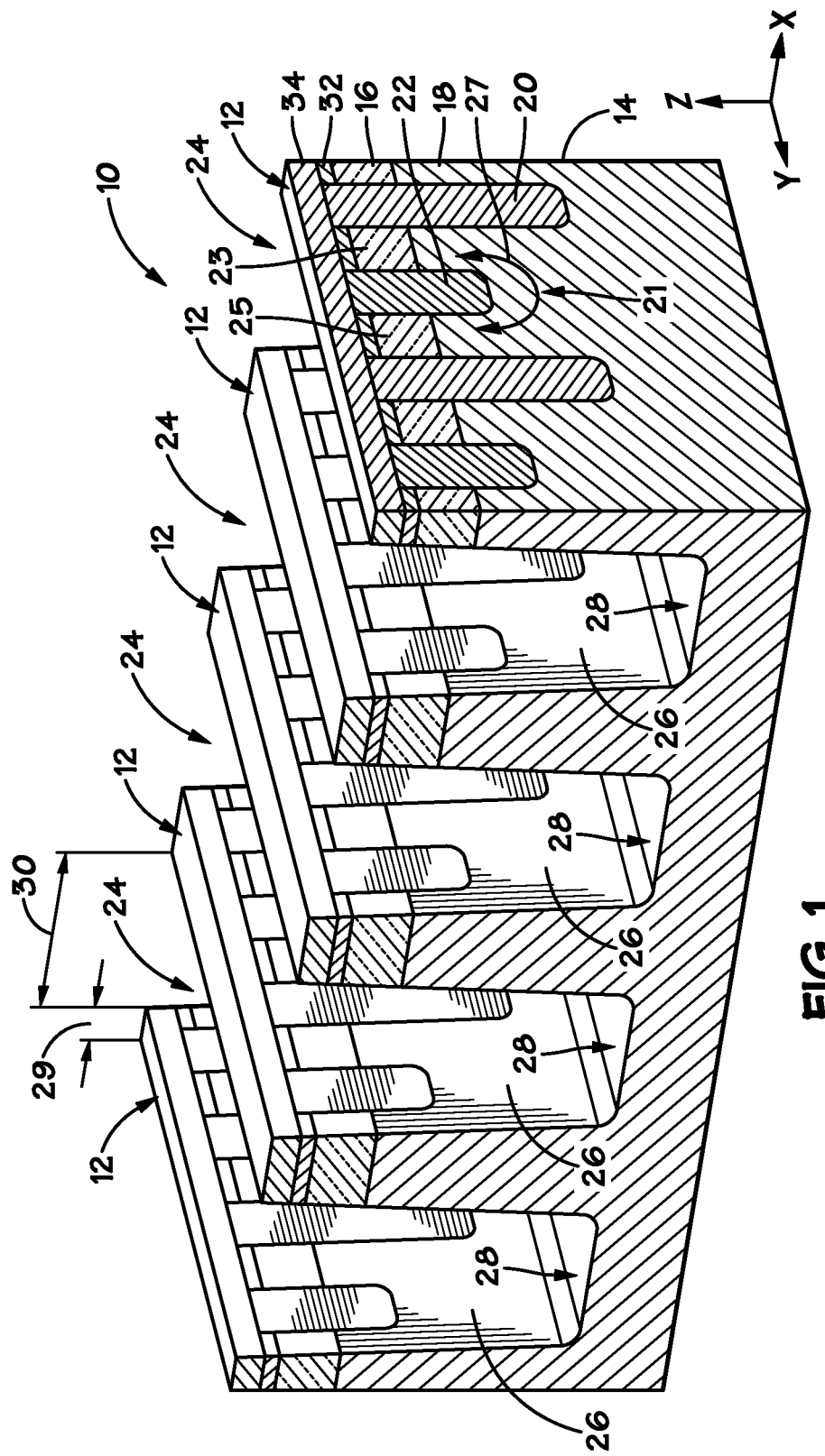
FIG. 1 depicts an embodiment of a portion of a semiconductor device in accordance with an embodiment of the present invention.

FIG. 1 depicts a cross-sectional plane view of a portion 10 of a memory array comprising high aspect ratio structures, e.g., fins 12, in accordance with an embodiment of the present invention. As used herein, the term "fin" refers to a tall, thin, semiconductor member extending from a substrate and generally having a length (i.e., y-direction) greater than the width (i.e., x-direction) and the depth (i.e., z-direction) of the fin. The high aspect ratio structures 12 may be formed in and on a substrate 14 having an upper doped region 16 and a lower doped region 18 formed in the substrate 14 by any suitable processes. The substrate 14 may include semiconductive materials such as single crystalline or poly crystalline silicon, gallium arsenide, indium phosphide, or other materials with semiconductor properties. Alternately, or additionally, the substrate 14 may include a non-semiconductor surface on which an electronic device may be constructed such as a plastic or ceramic work surface, for example. The substrate 14 may be in the form of a whole wafer, a portion of a diced wafer, or a portion of a diced wafer in a packaged electronic device, for instance.

The upper doped region 16 and the lower doped region 18 may be differently doped. For example, the upper doped region 16 may be an n+ material and the lower doped region 18 may be a p− material (referred to as a "p-well"). The depth of the upper doped region 16 may be generally uniform over a substantial portion of the substrate 14, such as throughout a substantial portion of an array area of a memory device, for example. The upper doped region 16 and lower doped region 18 may be formed by implanting or diffusing dopant materials. Alternatively, or additionally, one or both of these regions 16 and/or 18 may be doped during growth or deposition of all or part of the substrate 14, such as during epitaxial deposition of a semiconductive material or during growth of a semiconductive ingot from which wafers may be cut. As is explained below, the upper doped region 16 may form a source and a drain of an access device, e.g., a transistor, and the lower doped region 18 may form a channel of an access device, e.g., a transistor.

The array portion 10 may include deep isolation trenches 20 and shallow trenches 22 that may be formed in the substrate 14. These trenches 20 and 22 may generally extend in the y-direction, as indicated in FIG. 1. The deep isolation trenches 20 generally separate access devices, e.g., transistors, formed in the high aspect ratio structures, and the shallow trenches 22 generally separate the source and drain of a single access device. One or more shallow trenches 22 may be interposed between pairs of the deep isolation trenches 20. In some embodiments, the shallow trenches 22 may be deeper than the upper doped region 16 to separate sources and drains. Additionally, the deep isolation trenches 20 may be deeper than the shallow trenches 22 to isolate subsequently formed access devices, e.g., transistors. The deep isolation trenches 20 and/or shallow trenches 22 may have a generally rectangular or trapezoidal cross-section, and, in some embodiments, their cross-section may be generally uniform through some distance in the y-direction, for example through a distance larger than one, two, five, or more transistor lengths. The deep isolation trenches 20 and shallow trenches 22 may be partially or entirely filled with various dielectric materials, such as high density plasma (HDP) oxide, for instance, to electrically isolate features. Additionally, the deep isolation trenches 20 and/or shallow trenches 22 may include various liner materials, such as silicon nitride for example, to relieve film stresses, improve adhesion, and/or function as a barrier material.

The fins 12 may include a transistor 21 formed by a source 23 and drain 25 in the upper doped region 16 and a conductive channel 27 formed in the lower doped region 18. This structure may be referred to as a fin field-effect transistor (finFET). To activate the transistors 21 of a fin 12, a source to drain current is induced in the channel 27 by upper and lower gates subsequently formed in the row trenches 24.

The fins 12 may be formed in the substrate 14 and separated via row trenches 24, forming sidewalls 26 on one or both sides of each fin 12 and a bottom surface 28. The row trenches 24 may be formed by any suitable process. For example, in an embodiment, the row trenches 24 may be formed in the substrate 14 through use a mask, sub-photolithographic techniques, any suitable etching, or combination thereof.

The fins 12 may define regions having a width 29 and the row trenches 24 may define regions having a width 30. In some embodiments, the row trenches 24 may be formed using a mask with a sub-photolithographic process, e.g., a sidewall-spacer process, a resist-reflow process, or a linewidth thinning process. The widths 28 and 30 may be generally equal to or less than F, ¾ F, or ½ F, wherein F refers to the photolithographic-resolution limit or minimum achievable feature size. In one embodiment, the width 29 of the fins 12 may be about 30 nanometers, 20 nanometers, or less, and the width 30 of the row trench 24 may be about 40 nanometers, 30 nanometers, or less.

The fins 12 may include one or more materials the above upper doped region 16. In some embodiments, as shown in FIG. 1, the fin 12 may include, for example, a pad oxide cap 32 and a silicon nitride cap 34. The pad oxide cap 32 and silicon nitride cap 34 may be formed from pad oxide and silicon nitride respectively during etch of the row trenches 24 and formation of the fins 12. In other embodiments, other materials may be disposed on the fins 12.

FIGS. 2-5 depict formation of lower gates in the trenches 24 and adjacent to each of the sidewalls 26 of the fins 12. It should be appreciated that, as used herein, the term "lower" refers to the location of the gate relative to the trenches 24, such that lower gates are nearer to the bottom surface 28 of the trenches 24. Thus, the lower gates are relatively closer to the substrate 14 and farther from the upper portion of the fins 12 than subsequently formed upper gates.

Figure 2:
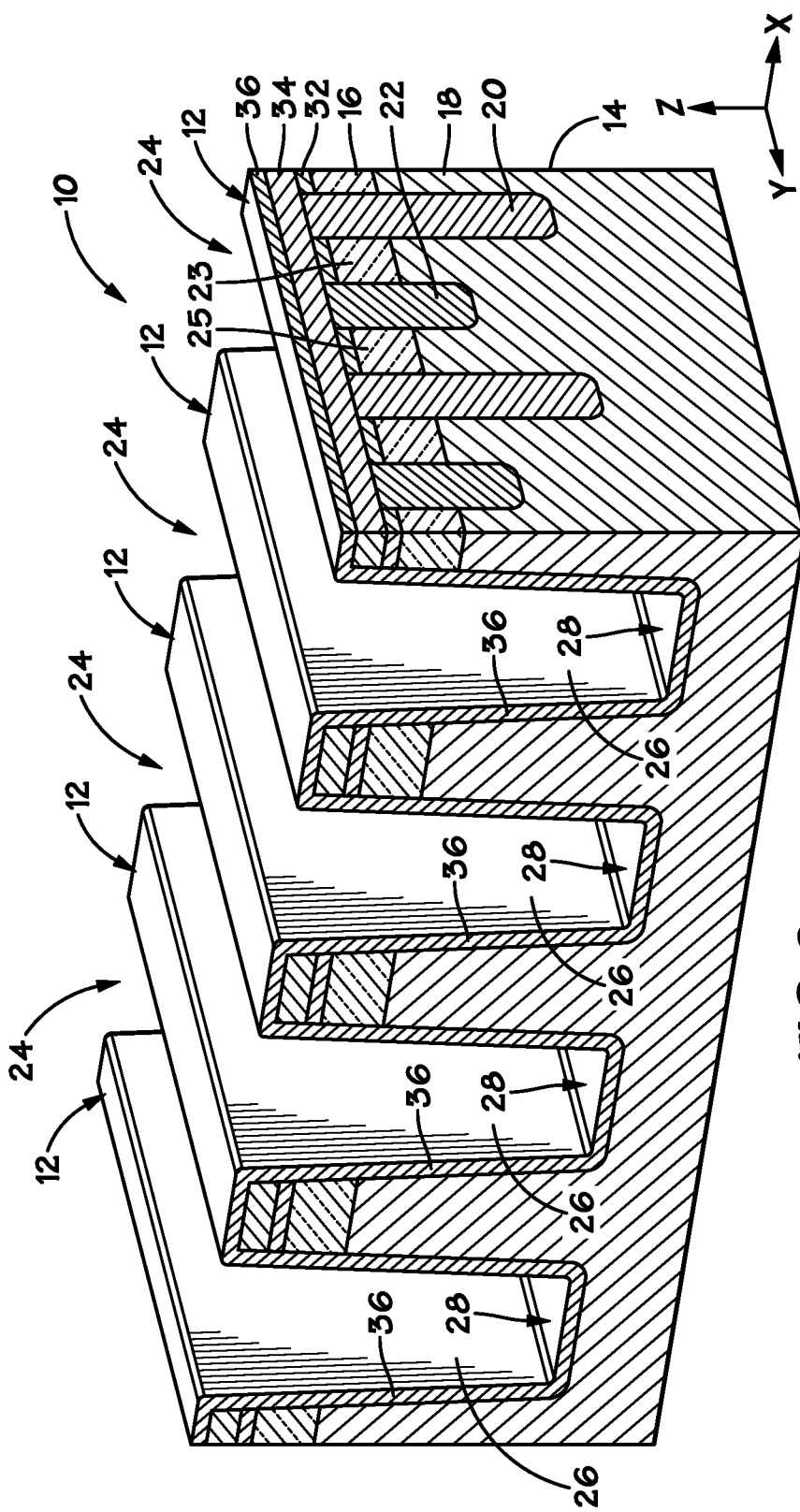
FIGS. 2-5 depict an embodiment of a process for forming lower gates of the device of FIG. 1.

As shown in FIG. 2, a gate oxide 36 may be formed on the sidewalls 26 of the fins 12 and the bottom portion 28 of the trenches 24. The gate oxide 36 may be deposited, grown, or otherwise formed, and it may substantially or entirely cover the exposed portions of the upper doped region 16 and the lower doped region 18. The gate oxide 36 may include a variety of dielectric materials, such as oxide (e.g., silicon dioxide), oxynitride, or high-dielectric constant materials like hafnium dioxide, zirconium dioxide, and titanium dioxide. The gate oxide 36 may have a thickness less than about 60 Å, e.g., a thickness equal to or less than about 40 Å.

Figure 3:
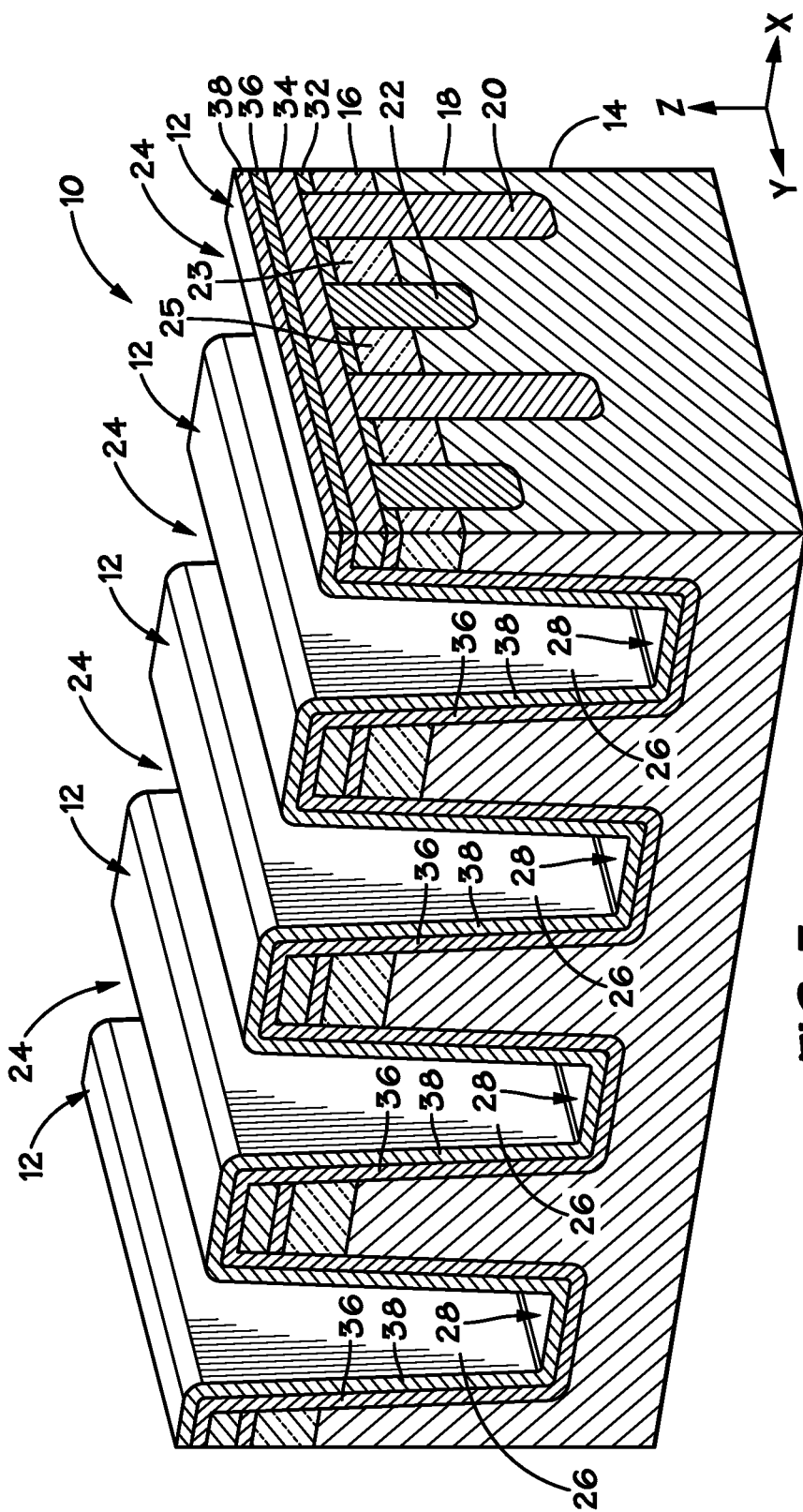

Next, in FIG. 3, a liner 38 may be formed on the gate oxide 36 in accordance with an embodiment of the present invention. As shown in FIG. 3, the liner 38 may be formed on the bottom portion 28 of the row trenches 24 and on the sidewalls 26 of the fins 12. The liner 38 may include titanium nitride (TiN), tungsten nitride, or other appropriate conductive materials or combination thereof. In some embodiments, the liner 38 may have a thickness less than about 40 Å, e.g., a thickness equal to or less than about 30 Å.

Figure 4:
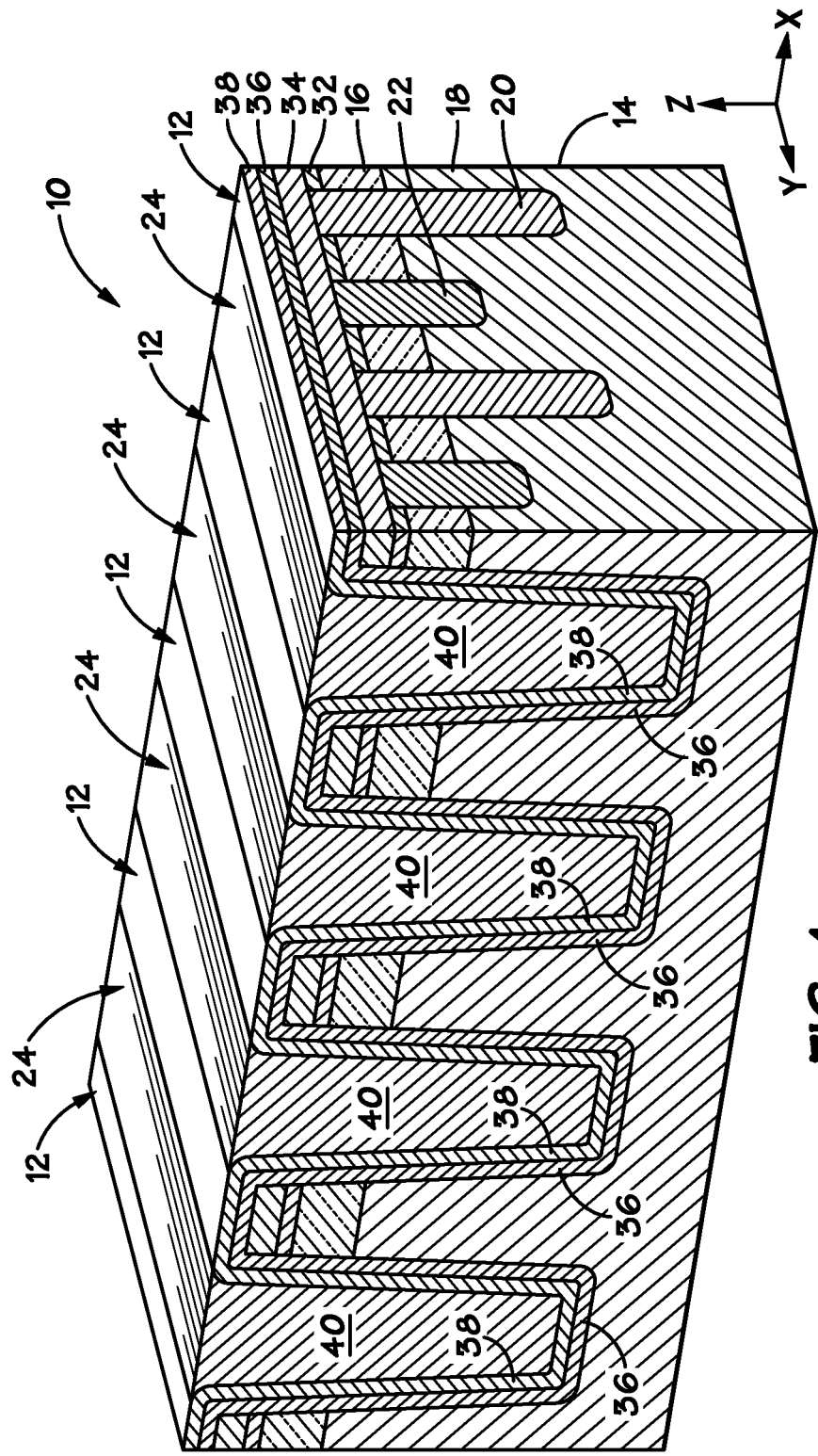

As shown in FIG. 4, a metal conductor 40 may be formed on the array portion 10 in accordance with an embodiment of the present invention. The metal conductor 40 may be formed in the row trenches 24 and on the sidewalls 26 of the fins 12. As will be appreciated, only that portion of the metal conductor 40 in the trenches 24 is illustrated. The metal conductor 40 may include tungsten, ruthenium (Ru), or other appropriate conductive materials or combination thereof. For example, in one embodiment, titanium nitride liner 38 may be disposed on the gate oxide 36, and tungsten may be disposed on the titanium nitride liner 38 to form the metal conductor 40. As discussed further below, etching of the metal conductor 40 may form bottom gates (e.g., wordlines) in the row trenches 24 on either of the sidewalls 26 of the fins 12.

Figure 5:
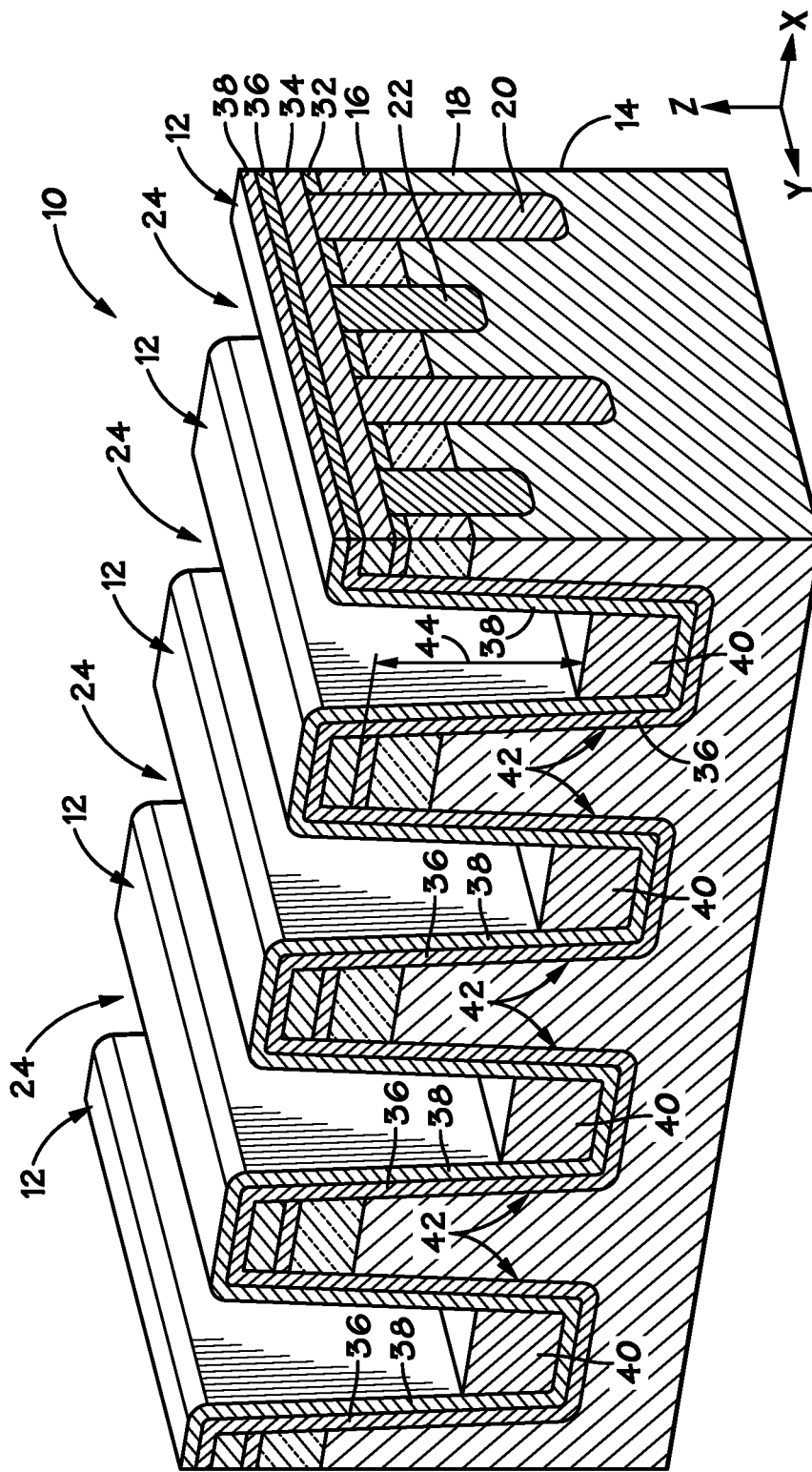

In certain embodiments, the formation of the upper gates may be accomplished during or after etch of the metal conductor 40 by separating an upper portion of the liner 38 from the lower portion of the liner 38 during etch of the metal conductor 40. FIG. 5 depicts the array portion 10 after a removal of a portion of the metal conductor 40 to form lower gates 42 in accordance with an embodiment of the present invention. As shown in FIG. 5, the metal conductor 40 may be removed to a depth 44 in the trenches 24. The metal conductor 40 may be removed by one of or a combination of etch processes, such as wet etch, dry etch, or other suitable processes. The duration of the etch may control the depth (e.g., distance) of the etch into the row trench 24. As explained below, the un-etched upper portions of the liner 38 may form upper gates above the lower gates 42.

Figure 6:
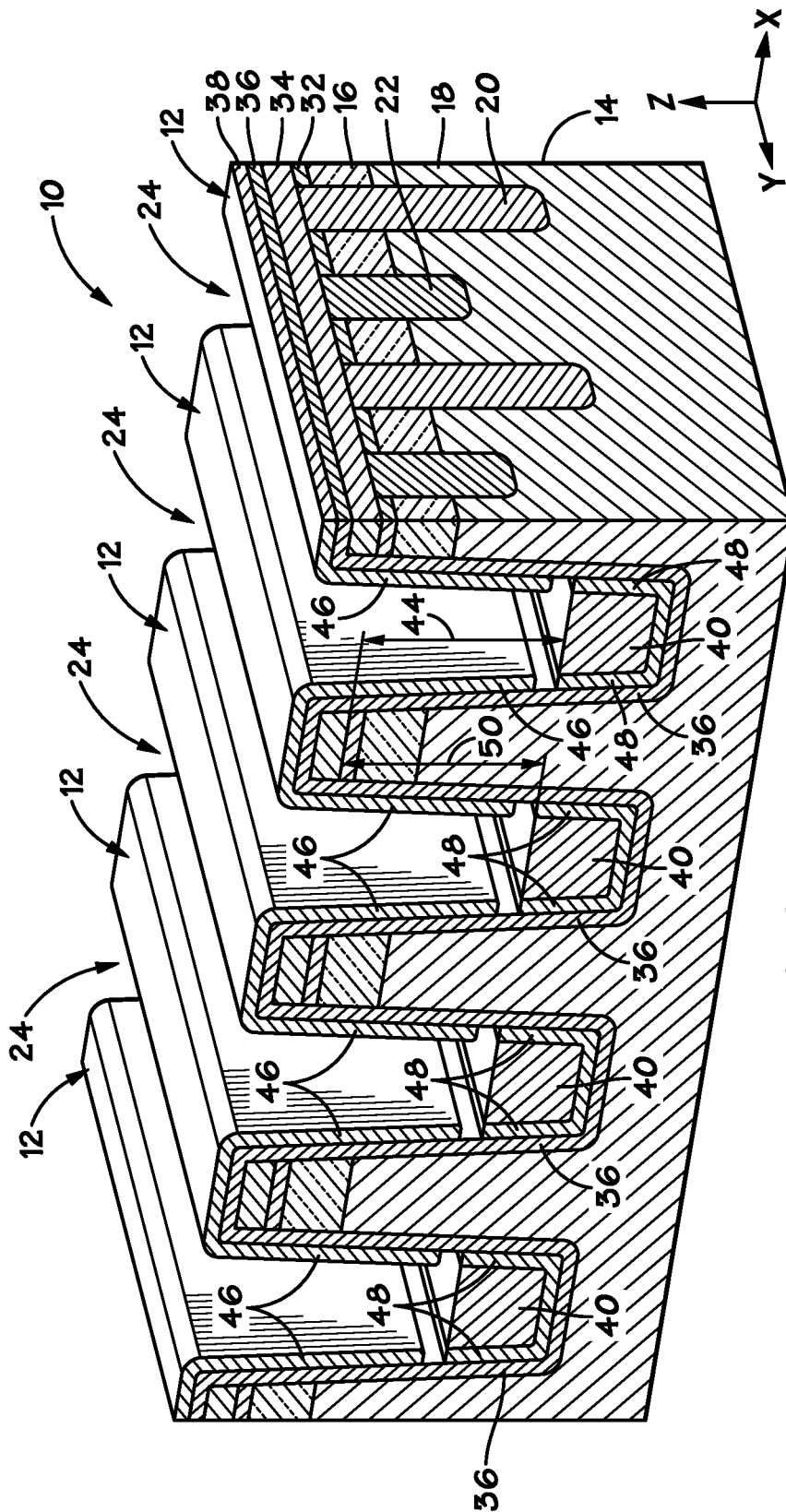
FIGS. 6-9 depict an embodiment of a process for forming upper gates of the device of FIG. 1.

After etching of the metal conductor 40, the upper gates may be formed by ion bombardment to separate portions of the liner 38. FIG. 6 depicts the array portion 10 after ion bombardment to separate the liner 38 in accordance with an embodiment of the present invention. The ion bombardment, of the liner 8 may be performed during or after etch of the metal conductor 40 described above in FIG. 5. For example, the etch may naturally separate the liner 38 near the top of the metal conductor 40. As shown in FIG. 6, after ion bombardment the liner 38 may be separated into an upper portion 46 and a lower portion 48. The ion bombardment may result from sputter from the metal conductor 40 during ion etch of the conductor 40. The separation between the upper portion 46 and lower portion 48 thus occurs near the depth 44 of the metal conductor 40. After the separation, the liner 38 of the lower gates 42 may be formed at a depth 50. Thus, after etching, the metal conductor 40 may protrude slightly above the liner 38, such that the depth 50 is less than the depth 44. In other embodiments, the depth 50 may be equal to or greater than the depth 44.

Figure 7:
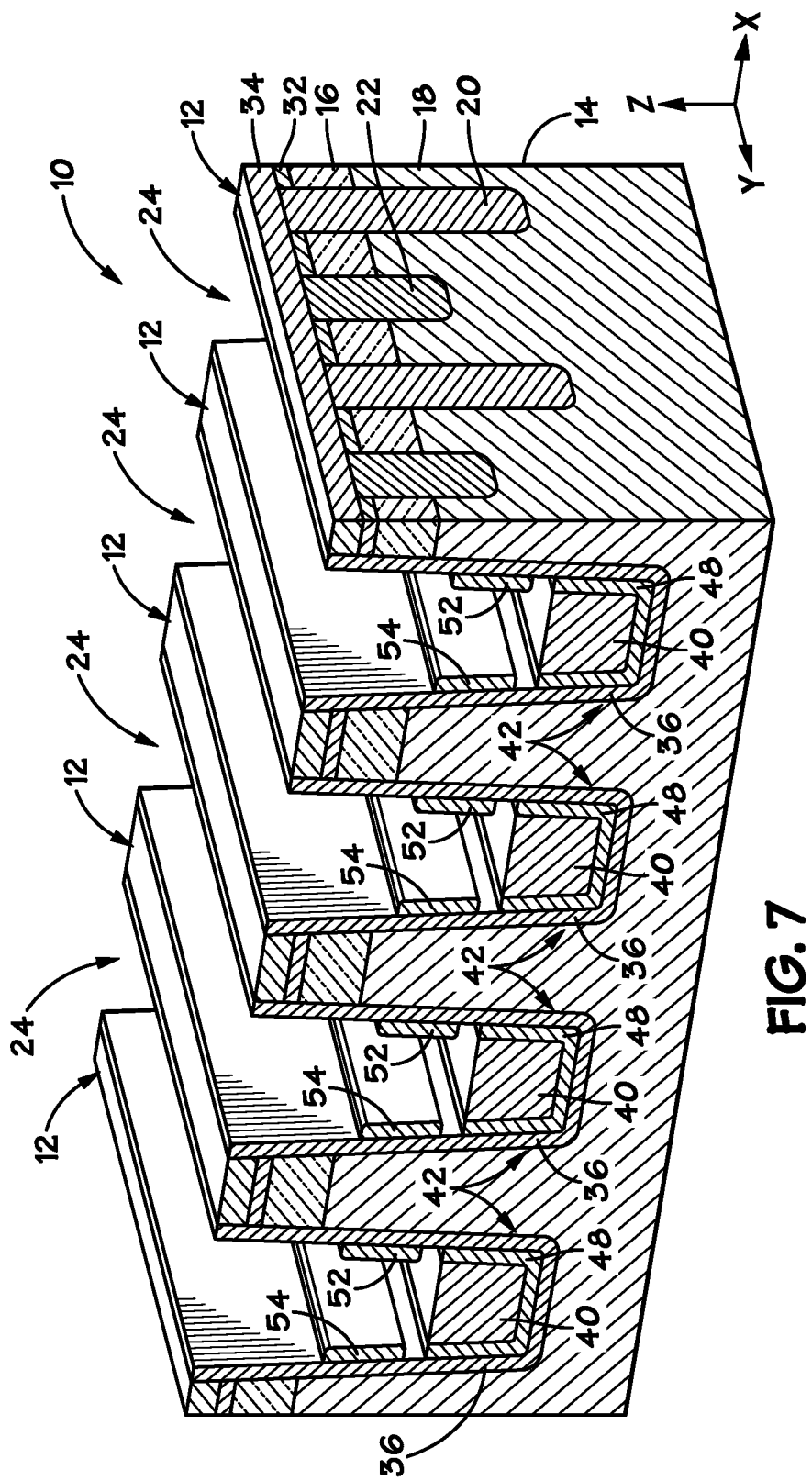

FIG. 7 depicts the array portion 10 after removal of the liner 38 in accordance with an embodiment of the present invention. As shown in FIG. 7, portion of the liner 38 may be removed to form upper gates 52 and 54 from the upper portion 46 of the liner 38. The gates 52 and 54 may connect to one another, e.g., by wrapping around the ends (not shown) of the fins 12, or they may be electrically independent. Accordingly, in some embodiments the upper gates 52 and 54 may be titanium nitride and the lower gate 42 may be tungsten. The liner may be removed by one of or a combination of etch processes, such as wet etch, dry etch, or other suitable processes. In some embodiments, portions of the liner 38 may be removed during etch of the metal conductor 40. Thus, in such embodiments, the steps described in FIGS. 5-7 may be accomplished during an etch process. In other embodiments, any one of or combination of the step described in FIGS. 5-7 may be performed using separate processes.

Figure 8:
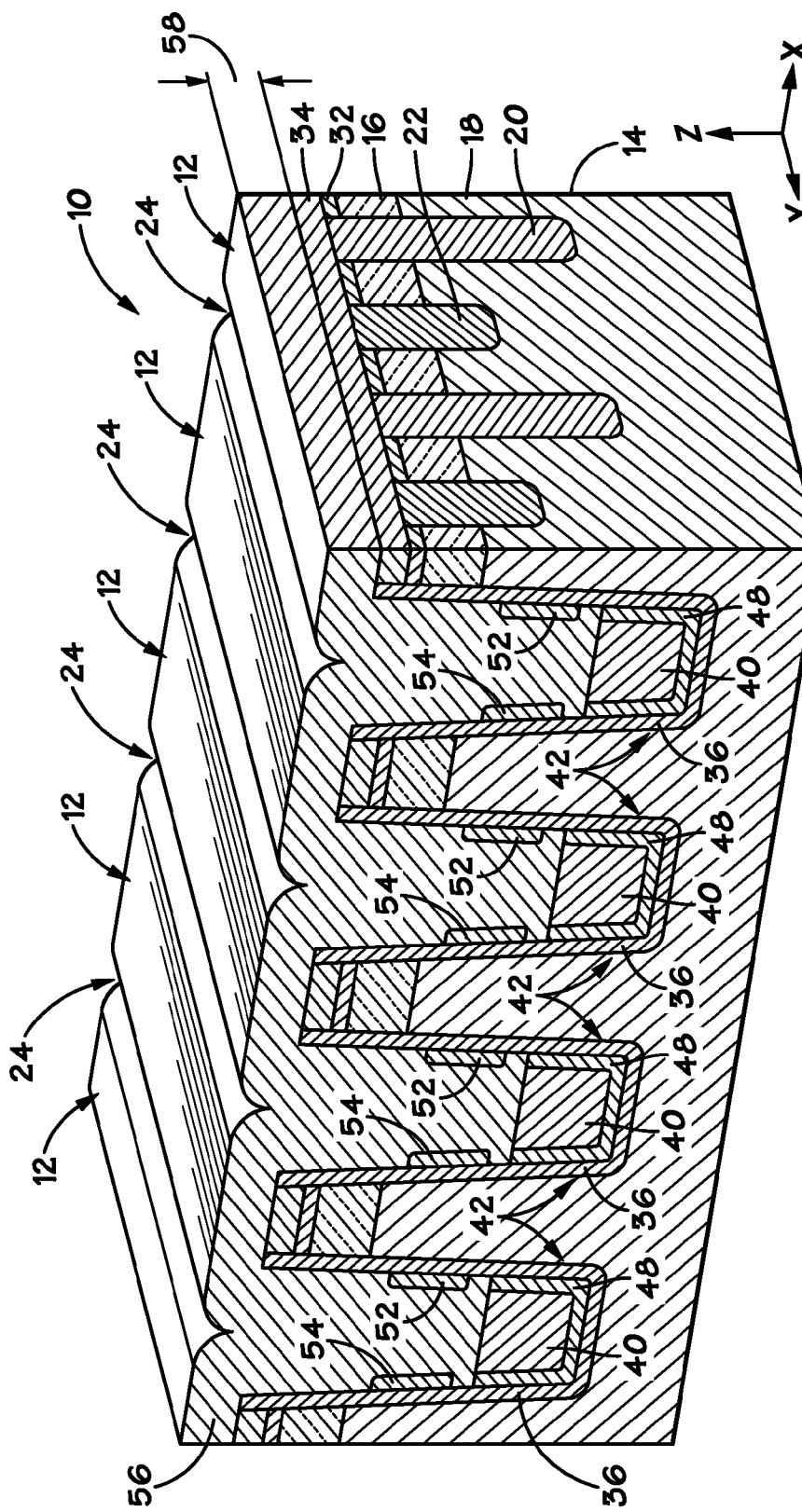

After forming the gates 42, 52 and 54, a dielectric 56 may be formed on the array portion 10, as illustrated by FIG. 8. The dielectric 56 may be formed with an overburden 58 to increase the likelihood of covering the gates upper gates 42 over a substantial portion of the portion 10. The dielectric 56 may include an oxide formed with TEOS CVD or other appropriate materials.

Figure 9:
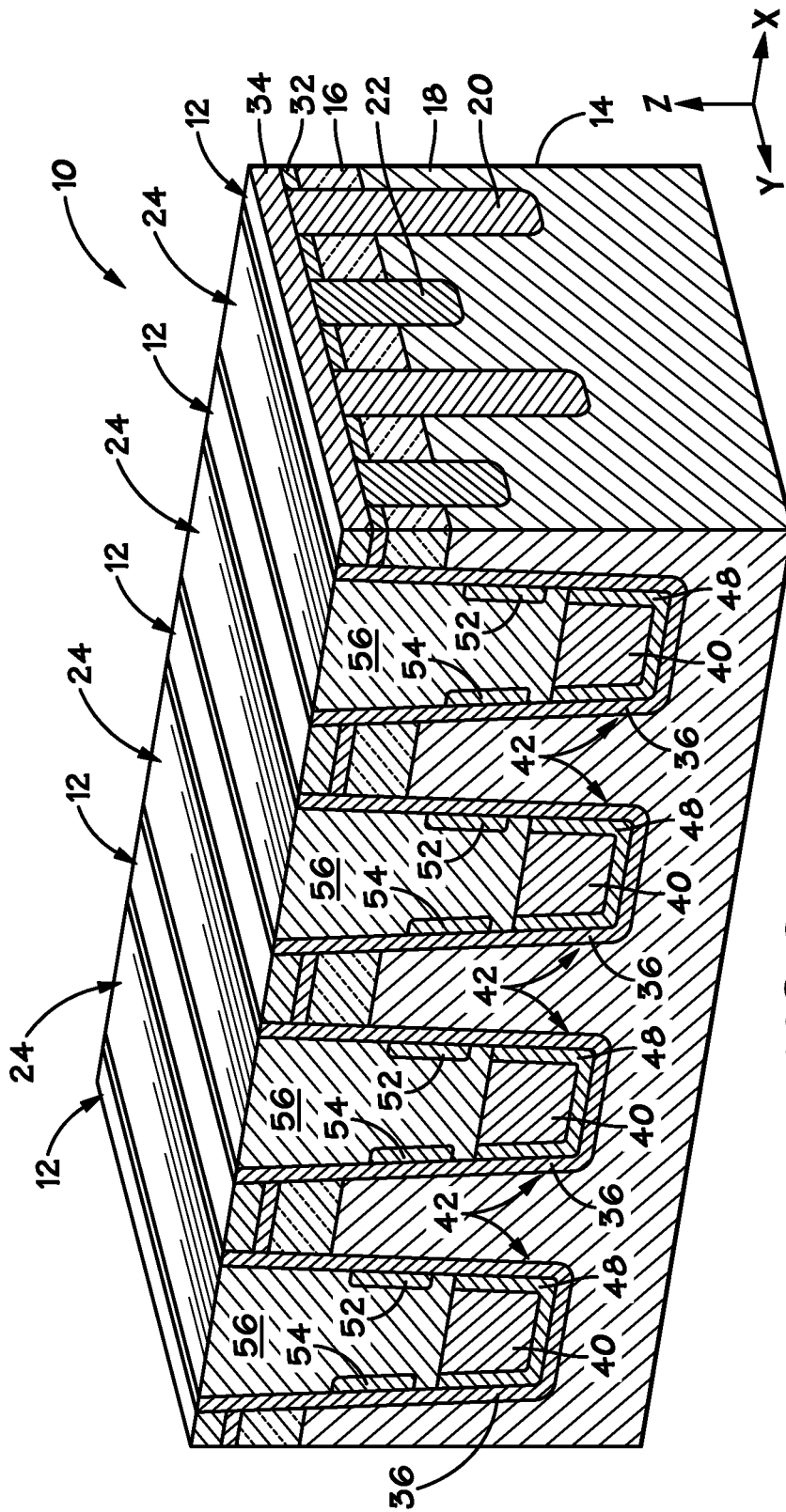

Next, the array portion 10 may be planarized, as illustrated by FIG. 9. Planarization may include processing the array portion 10 with a CMP process, an etch-back process, or other processes that planarize. The planarization process may stop on or in the upper doped region 16, removing the overburden 58 of the dielectric 56. As described further below, combinations of upper gates 52 and 54 and lower gates 42 may be used to activate the transistors 21 of the fins 12. Such a device may be referred to as a "cross-hair cell" as each access line (e.g., gates 52, 54, and 42) connects (i.e., forms a cross-point or cross-hair) with an access device (e.g., the transistors 21 of fins 12).

Figure 10:
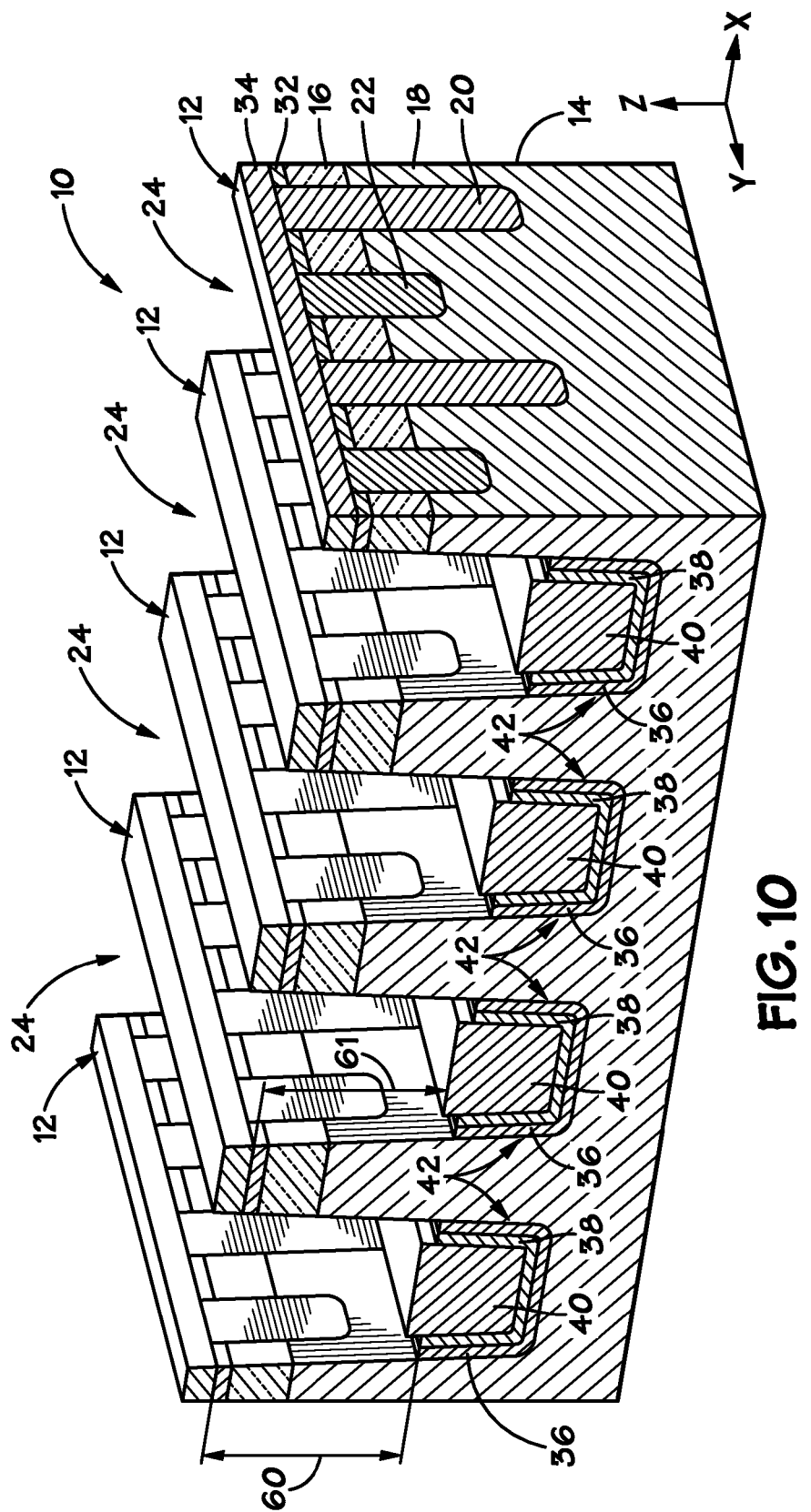
FIGS. 10-14 depict another embodiment of a process for forming upper gates of the device of FIG. 1.

In other embodiments, the upper gates may be separately formed after formation of the lower gates. FIGS. 10-14 depict formation of the upper gates after formation of the lower gates depicted in FIGS. 2-5 and in accordance with another embodiment of the present invention. FIG. 10 depicts the array portion 10 after a removal of a portion of the metal conductor 40, the liner 38, and the gate oxide 36 to form the lower gates 42 in accordance with an embodiment of the present invention. As shown in FIG. 10, the liner 38 and gate oxide 36 may be removed along the sidewalls 26 of the fins 12 to a depth 60. The metal conductor 40 may be removed to a depth 61 in the trenches 24. The metal conductor 40, the liner 38, and the gate oxide 36 may be removed by one of or a combination of etch processes, such as wet etch, dry etch, or other suitable processes. The duration of the etch may control the depth (e.g., distance) of the etch into the row trench 24. Additionally, in some embodiments, differing etch rates of the different materials may result in different depths 60 and 61. For example, as shown in FIG. 5, after etching, the metal conductor 40 may protrude slightly above the gate oxide 36 and the liner 38, such that the depth 60 is less than the depth 61. In other embodiments, the depth 60 may be equal to or greater than the depth 61.

Figure 11:
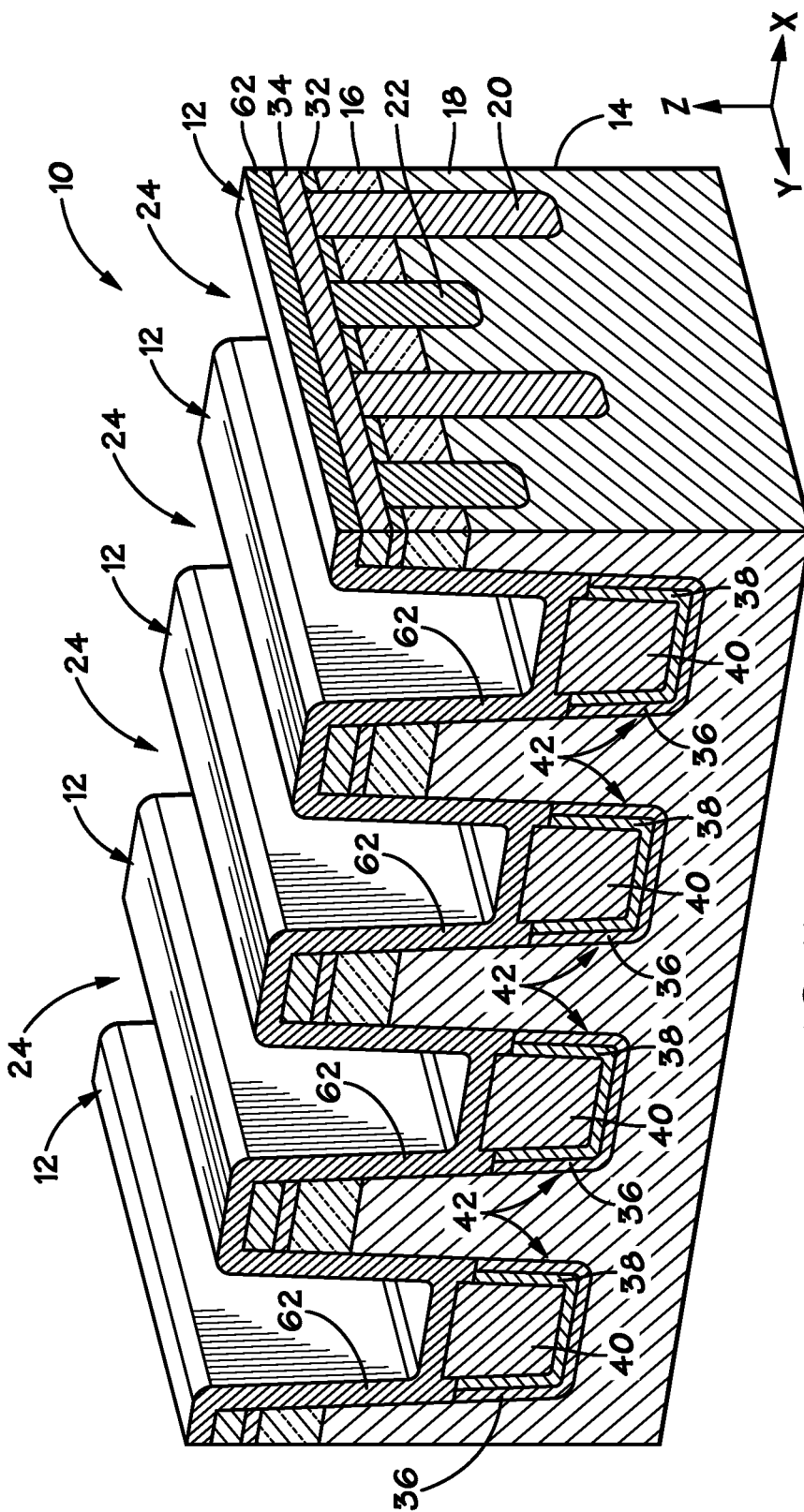

FIG. 11 depicts formation of a second gate oxide 62 on the sidewalls 26 of the fins 12 and on the lower gates 42, such as on the metal conductor 40, the liner 38, and the gate oxide 36. The second gate oxide 62 may be deposited, grown, or otherwise formed, and it may substantially or entirely cover the exposed portions of the upper doped region 16 and some of the lower doped region 18. The second gate oxide 62 may include a variety of dielectric materials, such as oxide (e.g., silicon dioxide), oxynitride, or high-dielectric constant materials like hafnium dioxide, zirconium dioxide, and titanium dioxide. The second gate oxide 62 may have a thickness less than about 60 Å, e.g., a thickness equal to or less than about 40 Å.

Figure 12:
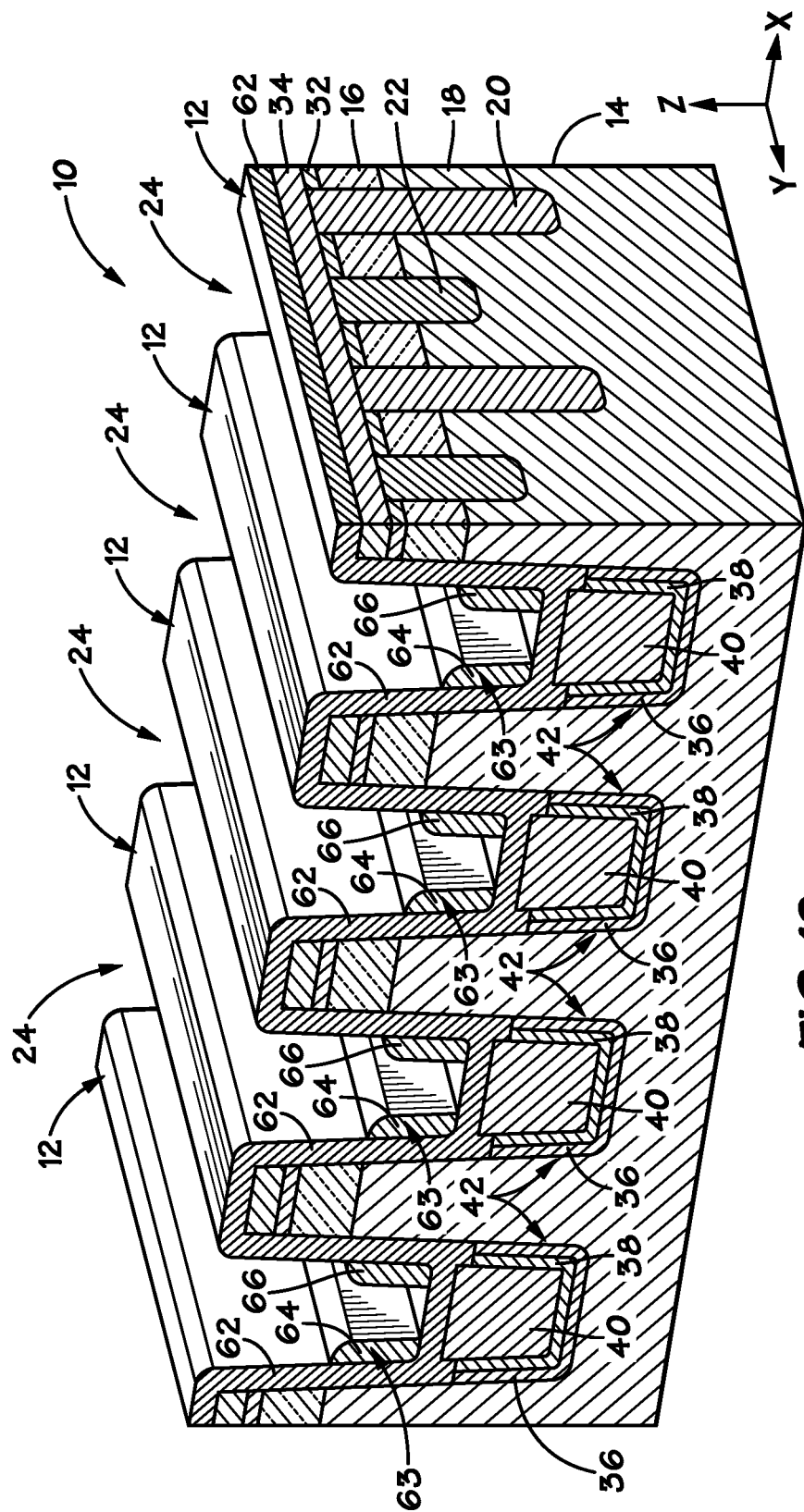

Next, a second conductor 63 may be formed on either side of the fins 12 to form upper gates 64 and 66, as illustrated by FIG. 12. The gates 64 and 66 may connect to one another, e.g., by wrapping around the ends (not shown) of the fins 12, or they may be electrically independent. The gates 64 and 66 may partially, substantially, or entirely overlap the upper doped region 112. The gates 64 and 66 may be sidewall spacers formed by depositing a conductive film on the array portion 10 and, then, anisotropically etching the conductive film until the conductive film is generally removed from horizontal surfaces, leaving the conductor 63 disposed against generally vertical surfaces. For example, the gates 64 and 66 may include TiN, Ru, or other appropriate conductive materials. In some embodiments, after depositing the conductor 63, but before etching the material to form spacers, a protective body may be formed on the conductive material. Examples of a protective body include a high-aspect-ratio-process (HARP) oxide formed on the conductor 63. The conductor 63 have a thickness less than about 40 Å, e.g., a thickness equal to or less than about 30 Å. If a protective body is used, the protective body may be anisotropically etched, e.g., dry etched, to expose generally horizontal portions of the conductive material, and the exposed portions of the conductive material may then be dry etched or wet etched, e.g., with an SC1 etch for less than 10 minutes, e.g., generally equal to or less than five minutes. After removing the exposed portions of the conductor 63, the remaining portion of the protective body may be removed with another etch that selectively removes the protective body, while leaving a substantial portion of the conductor 63 disposed against the sidewalls 26 of the fins 12.

Figure 13:
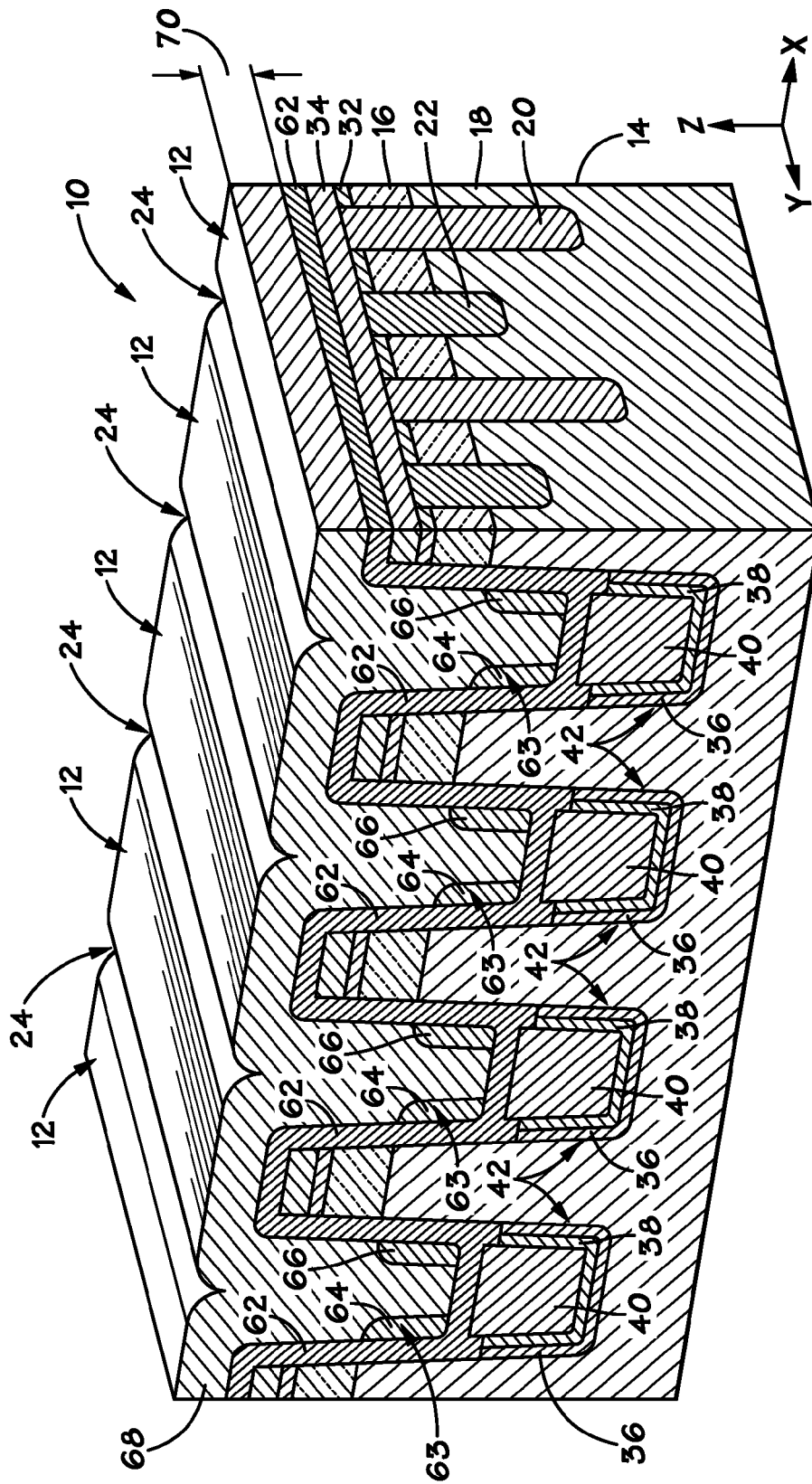
Figure 14:
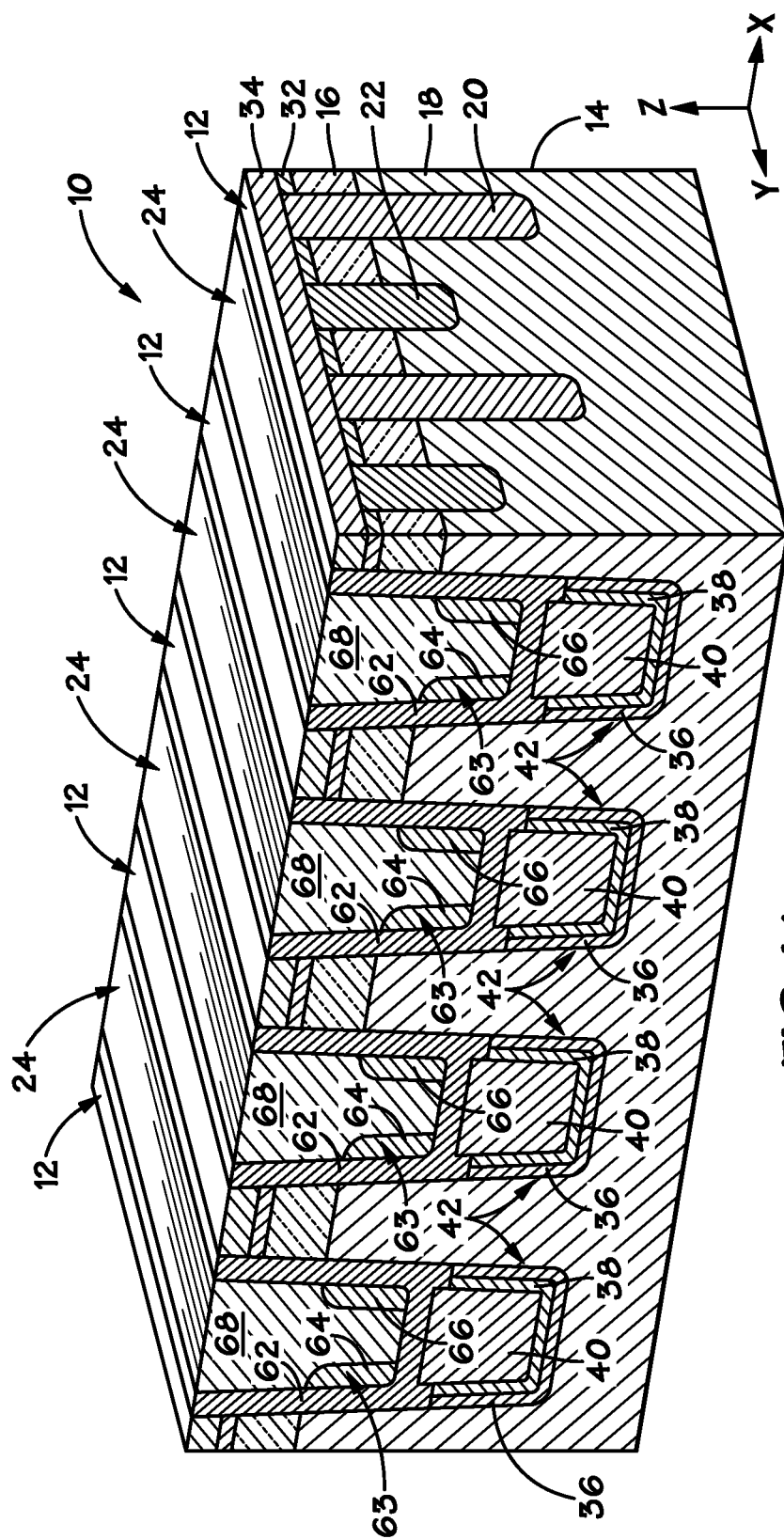

After forming the gates 64 and 66, as discussed above, a dielectric 68 may be formed on the array portion 10, as illustrated by FIG. 13. Here again, the dielectric 68 may be formed with an overburden 70 to increase the likelihood of covering the gates 64 and 66 over a substantial portion of the array portion 10. The dielectric 68 may include an oxide formed with TEOS CVD or other appropriate materials. In some embodiments, the dielectric 68 is formed with a thickness of less than about 1500 Å, e.g., equal to or less than about 1000 Å. Next, the array portion 10 may be planarized, as illustrated by FIG. 14. Planarization may include processing the substrate 110 with a CMP process, an etch-back process, or other processes that planarize. The planarization process may stop on or in the upper doped region 16, removing the overburden 70 of the dielectric 68. Here again, as described further below, combinations of upper gates 64 and 66 and lower gates 42 may be used to activate the transistors 21 of the fins 12. Such a device may be referred to as a "cross-hair cell" as each access line (e.g., gates 64, 66, and 42) connects (i.e., forms a cross-point or cross-hair) with an access device (e.g., the transistors 21 of fins 12).

Figure 15:
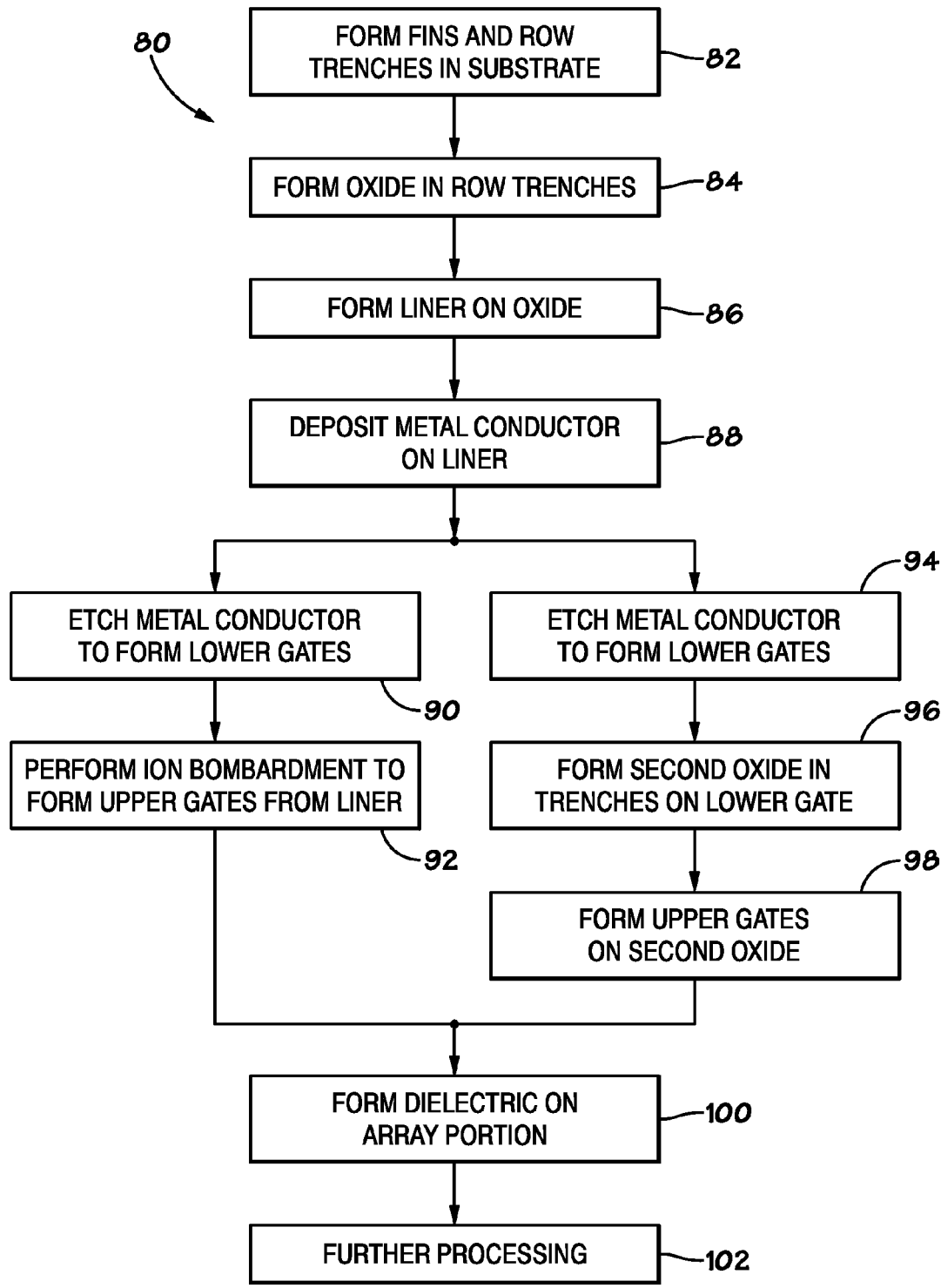
FIG. 15 is flowchart depicting the manufacturing process of FIGS. 1-9 in accordance with an embodiment of the present invention.

FIG. 15 is a flowchart of a manufacturing process 80 in accordance with the embodiments depicted above in FIGS. 1-14. As described above in FIG. 1, fins 12 and row trenches 24 may be formed in the substrate 14 by any suitable process (block 82). An oxide 36 may be formed in the row trenches 24 on the sidewalls 26 and bottom surface 28 of the row trenches 24 (block 84), a liner 38 may be formed on the oxide (block 86), and a metal conductor may be deposited in the row trenches 24 (block 88), as shown above in FIGS. 2-4.

Next, as shown in FIG. 5, the metal conductor 40 may be etched to a desired depth to form the lower gates 42 (block 90). As discussed above in FIGS. 5-7, during or after the etch, ion bombardment may separate an upper portion of the liner 38 to form upper gates 52 and 54 (block 92), and remaining portions of the liner 38 may be removed.

In other embodiments, as shown in FIGS. 10 and 11, the metal conductor 40 may be etched to a desired depth to form the lower gates (block 94), and a second oxide 62 may be formed in the row trenches on the lower gates (block 96). In such an embodiment, as described above in FIG. 12, the upper gates 64 and 66 may be created through formation of a second conductor on the second oxide 62 (block 98).

After formation of the upper gates (block 92 or block 98), a dielectric may be formed on the array portion 10 (block 100), such as in the row trenches 24. As will be appreciated by those of ordinary skill in the art, after formation of the upper and lower gates, the array portion 10 may be subjected to further processing (block 102).

Figure 16:
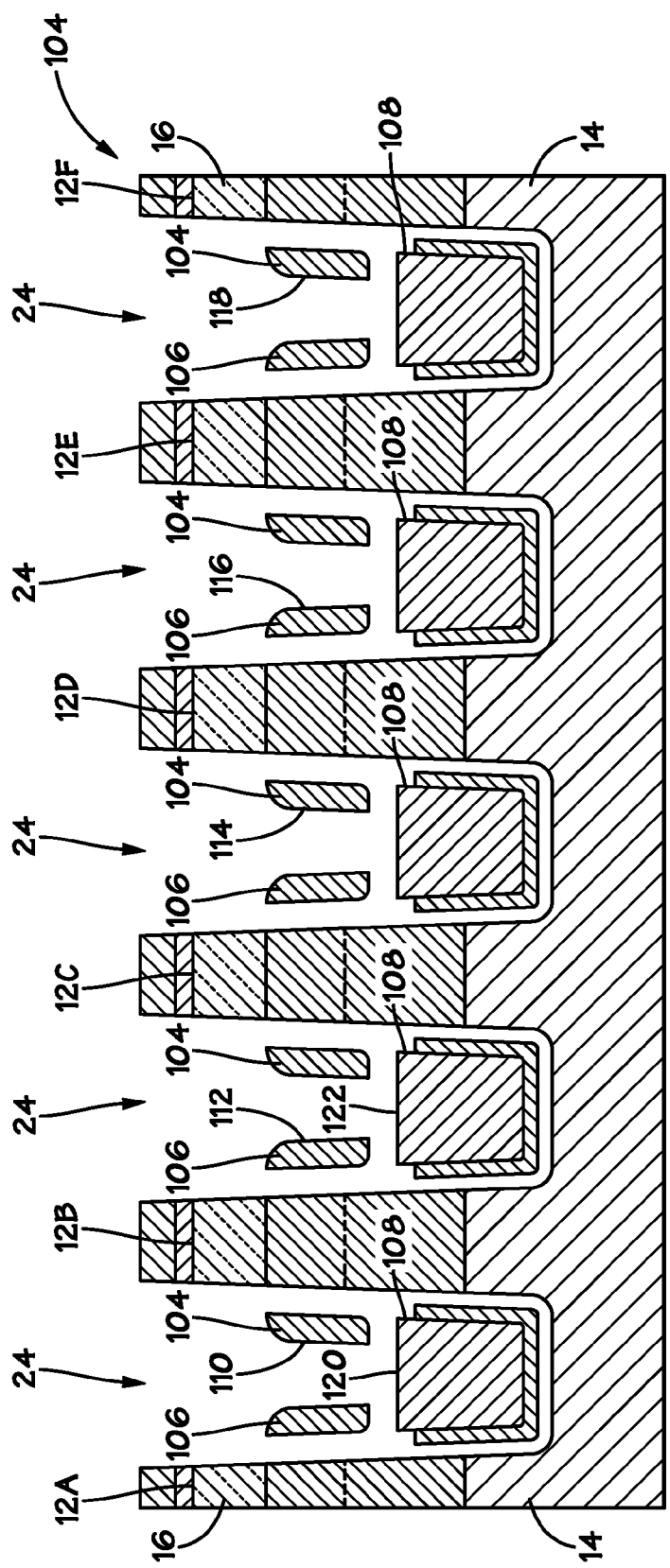
FIGS. 16 and 17 depict operation of an array portion having upper gates and lower gates in accordance with another embodiment of the present invention.
Figure 17:
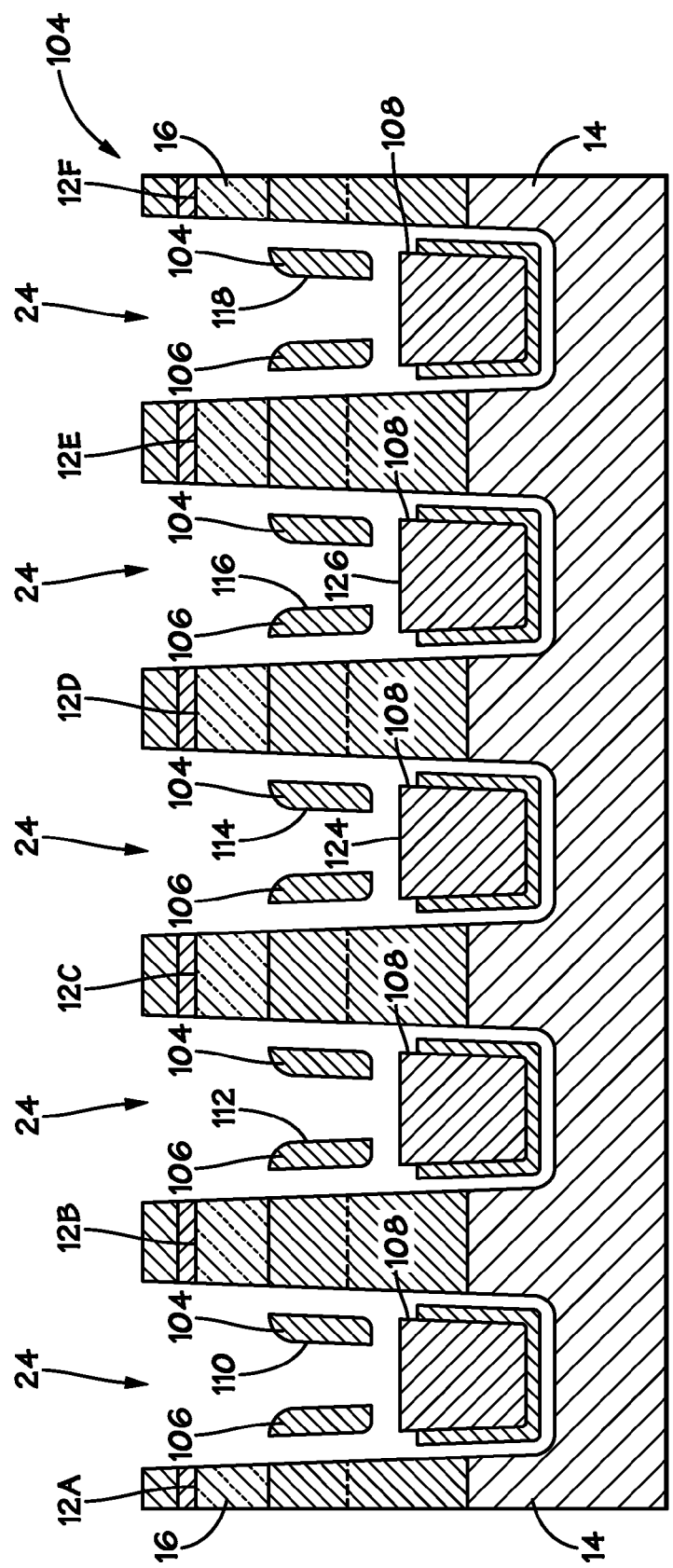

FIGS. 16 and 17 are schematic cross-sections of an array portion 104 formed in the manner described above in FIGS. 1-14 and depicting operation of upper gates 104 and 106 and lower gates 108 to operate the transistors of fins 12. FIGS. 15 and 16 depict fins 12A-12F separated by row trenches 24 and each having upper gates 104 and 106 and lower gates 108 disposed therebetween and constructed according to the techniques described above. As stated above, the upper gates 104 and 106 may be relatively highly resistive as compared to the lower gates 108, resulting in a relatively longer response time (e.g., slow switching). In contrast, the lower gates 108 may be of a relatively low resistance, as compared to the upper gates 104 and 106, and may have a relatively quicker response time. For example, the cross-sectional area through the lower gates 108 may be less than the cross-sectional area through the upper gates 104 and 106. In another example, the conductor 40 of the lower gates 108 may be a different material than the conductor 62 (or liner 38). In such an embodiment, an access line (e.g., a wordline) may be considered to include the upper gates 104 and 106 and the lower gates 108. Accordingly, to operate a transistor, such as to activate a specific wordline formed by the upper gates 104 and/or 106 and the lower gate 108, both the upper and lower gates may be biased to a desired voltage. In some embodiments, as noted above, the upper gates 104 and 160 may connect to one another, e.g., by wrapping around the ends (not shown) of the fins 12, or they may be electrically independent As explained below, the lower gates 108 may provide for relatively fast selection of upper gates 104 and 106 of a specific fin 12.

FIG. 16 depicts operation of the transistors of fin 12B in accordance with an embodiment of the present invention. In some embodiments, upper gates 104 and 106 may be biased to a first voltage to preselect gates of the fins 12. In other embodiments, if the upper gates 104 and 106 are electrically independent, each upper gate may be biased to a first and second voltage respectively. For example, as shown in FIG. 16, upper gates 110 and 112 may be used to preselect fin 12B, upper gates 114 and 116 may be used to preselect fin 12D, and upper gate 118 and a corresponding upper gate (not shown) may be used to preselect fin 12F. After preselecting the desired fins 12, the transistors of a specific fin 12 may be operated by biasing the lower gates 120 and 122 on either side of the fin 12 to a second voltage. Thus, to operate the transistors of in 12B, the lower gates 120 and 122 may be biased to a desired voltage, allowing relatively faster selection of the fin 12B and operation of the corresponding transistors. Further, as compared to the upper gates 110 and 112, the lower gates 120 and 122 exhibit minimal capacitive coupling during operation.

FIG. 17 depicts operation of the transistors of fin 12D in accordance with an embodiment of the present invention. Again, as shown in FIG. 17, upper gates 110 and 112 may be used to preselect fin 12B, upper gates 114 and 116 may be used to preselect fin 12D, and upper gate 118 and a corresponding upper gate (not shown) may be used to preselect fin 12F. To operate the transistors of in 12D, lower gates 124 and 126 may be biased to a second voltage, allowing relatively faster selection of the fin 12D and operation of the corresponding transistors. In this manner, each fin 12 of the array portion 104 may be preselected by biasing the upper gates 104 and 106 surrounding each fin 12, and the lower gates 108 may be biased to select a desired fin 12 and operate transistors of the selected fin 12.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A semiconductor device, comprising;
   a first fin and a second fin separated by a trench;
   a first conductor disposed in the trench and extending substantially parallel to a sidewall of the first fin and a sidewall of the second fin to form a first gate, wherein the first conductor substantially fills a bottom portion of the trench; and
   a second conductor disposed in the trench above the first conductor and on the sidewall of the first fin to form a second gate, wherein the second conductor is electrically isolated from the first conductor; and
   a third conductor disposed in the trench above the first conductor and on the sidewall of the second fin to form a third gate, wherein the third conductor is electrically isolated from the first conductor.

2. The device of claim 1, wherein the second gate is electrically coupled to the third gate.

3. The device of claim 1, comprising an oxide disposed on a bottom surface of the trench and on the sidewalls of the first fin and second fin.

4. The device of claim 3, comprising a liner disposed on the oxide.

5. The device of claim 4, wherein the second conductor and third conductor are formed from the liner.

6. The device of claim 5, wherein the liner comprises titanium nitride.

7. The device of claim 1, wherein the first conductor comprises tungsten.

8. The device of claim 1, wherein a cross-section through the first conductor has a greater area than a cross-section through the second conductor and a greater area than a cross-section through the third conductor.

9. A semiconductor device, comprising:
   a semiconductor fin;
   a first lower gate formed in a first trench adjacent a first side of the semiconductor fin, wherein the first lower gate substantially fills a bottom portion of the first trench;
   a first upper gate formed in the first trench on the first lower gate and on the first side of the semiconductor fin; and
   a second upper gate formed in a second trench adjacent a second side of the semiconductor fin.

10. The device of claim 9, comprising a second lower gate formed in the second trench, wherein the second upper gate is formed on the second lower gate.

11. The device of claim 9, wherein the first upper gate and the second upper gate are separated by a dielectric.

12. A semiconductor device, comprising:
   a first sidewall of a first fin, the first sidewall extending in a first direction;

a second sidewall of a second fin, the second sidewall extending in the first direction, wherein the first sidewall and second sidewall generally define a trench having a bottom surface;

an oxide on the first sidewall, second sidewall, and bottom surface;

a liner on the oxide;

a first conductor on the liner forming a first gate; and wherein a portion of the liner is separated to form a second gate on the first sidewall and a third gate on the second sidewall.

13. The device of claim 12, wherein the second gate and third gate are vertically offset from the first gate relative to the first bottom surface.

14. The device of claim 12, comprising:

a third sidewall of the first fin, the third sidewall extending in the first direction; and a fourth sidewall of a third fin, the fourth sidewall extending in the first direction, wherein the third sidewall and fourth sidewall generally define a second trench having a second bottom surface.

15. The device of claim 14, comprising:

a second oxide on the third sidewall, fourth sidewall, and second bottom surface;

a second liner on the second oxide;

a second conductor on the second liner to form a third gate; and wherein an upper portion of the second liner is separated to form a fourth gate on the third sidewall and a fifth gate on the fourth sidewall.

16. The device of claim 15, wherein the fourth gate and fifth gate are vertically offset from the third gate relative to the second bottom surface.

* * * * *